United States Patent
Kwon et al.

(10) Patent No.: US 11,488,844 B2
(45) Date of Patent: Nov. 1, 2022

(54) FIRST CLEANING APPARATUS, CLEANING EQUIPMENT INCLUDING THE SAME, AND CLEANING METHOD

(71) Applicant: SK SILTRON CO., LTD., Gumi-si (KR)

(72) Inventors: Ki Soo Kwon, Gumi-si (KR); Joo Won Choi, Gumi-si (KR)

(73) Assignee: SK Siltron Co., Ltd., Gyeongsangbuk-do (KR)

( * ) Notice: Subject to any disclaimer, the term of this patent is extended or adjusted under 35 U.S.C. 154(b) by 0 days.

(21) Appl. No.: 17/145,647

(22) Filed: Jan. 11, 2021

(65) Prior Publication Data

US 2021/0242041 A1 Aug. 5, 2021

(30) Foreign Application Priority Data

Jan. 31, 2020 (KR) .................. 10-2020-0011953

(51) Int. Cl.
*H01L 21/00* (2006.01)
*H01L 21/67* (2006.01)
*H01L 21/02* (2006.01)

(52) U.S. Cl.
CPC .. *H01L 21/67051* (2013.01); *H01L 21/02052* (2013.01); *H01L 21/67057* (2013.01)

(58) Field of Classification Search
None
See application file for complete search history.

(56) References Cited

U.S. PATENT DOCUMENTS

| 5,950,643 | A | * | 9/1999 | Miyazaki | .......... H01L 21/67017 134/76 |
| 6,416,587 | B1 | * | 7/2002 | Lu | ........................... B08B 3/102 134/32 |
| 9,773,688 | B2 | | 9/2017 | Haibara et al. | |

(Continued)

FOREIGN PATENT DOCUMENTS

| CN | 103418574 A | 12/2013 |
| CN | 104347384 A | 2/2015 |

(Continued)

OTHER PUBLICATIONS

Chinese Office Action dated Jun. 29, 2022 issued in Application 202110097308.2.

*Primary Examiner* — Mikhail Kornakov
*Assistant Examiner* — Ryan L Coleman
(74) *Attorney, Agent, or Firm* — KED & Associates LLP (57) ABSTRACT

Disclosed is a first cleaning apparatus including a first cleaning bath, a cover provided at the upper part of the first cleaning bath, a drainage portion provided at the lower part of the first cleaning bath, a first cleaning unit and a second cleaning unit provided respectively at a first side surface and a second side surface in the first cleaning bath, and first and second moving units configured to move the first and second cleaning units, respectively, wherein each of the first and second cleaning units includes a plurality of cleaning solution supply pipes provided at different heights and a plurality of nozzles provided at each of the cleaning solution supply pipes, the nozzles provided at one cleaning solution supply pipe have identical cleaning solution spray angles, and the nozzles provided at the other cleaning solution supply pipes have different cleaning solution spray angles.

10 Claims, 5 Drawing Sheets

(56) References Cited

U.S. PATENT DOCUMENTS

2009/0095326 A1   4/2009  An et al.
2012/0240958 A1*  9/2012  Higuchi ............ H01L 21/67051
                                                   134/10

FOREIGN PATENT DOCUMENTS

| CN | 207781556 U | 8/2018 |
|---|---|---|
| KR | 10-1942222 | 1/2019 |
| KR | 10-1964567 | 4/2019 |
| KR | 10-1964568 | 4/2019 |
| KR | 10-1975721 | 5/2019 |

* cited by examiner

FIRST CLEANING APPARATUS, CLEANING EQUIPMENT INCLUDING THE SAME, AND CLEANING METHOD

CROSS REFERENCE TO RELATED APPLICATION

This application claims priority under 35 U.S.C. § 119 to Korean Patent Application No. 10-2020-0011953, filed in Korea on 31 Jan. 2020, which is hereby incorporated in its entirety by references as if fully set forth herein.

TECHNICAL FIELD

Embodiments relate to cleaning of wafers, and more particularly to a first cleaning apparatus capable of separating particles from a plurality of wafers sawn using a wire, cleaning equipment including the same, and a cleaning method.

BACKGROUND

A general silicon wafer is formed through a single-crystal growth process of forming a single-crystal ingot, a slicing process of slicing the single-crystal ingot to obtain a thin disc-shaped wafer, a lapping process of removing damage due to mechanical machining remaining on the wafer due to slicing, a polishing process of polishing the wafer, and a cleaning process of removing a polishing agent and foreign matter from the polished wafer.

In addition to the cleaning process after the polishing process, it may be necessary to perform a cleaning process of separating particles from the surface of the wafer before the wafer is lapped after the slicing process.

The reason for this is that, when the single-crystal ingot is sliced to the thickness of the wafer, foreign matter (particles), such as polished powder, is generated and attached to the wafer.

In general, a wafer cleaning apparatus is capable of soaking an ingot block having a plurality of separated wafers fixed thereto in a cleaning bath filled with a cleaning solution for a predetermined time to clean the wafers. In the case in which cleaning is performed in the state in which the ingot block is stationary in the cleaning bath, however, non-uniform cleaning may be performed.

A method of injecting air into the cleaning bath together with the cleaning solution to generate microbubbles in order to remove foreign matter from the wafers may also be used. However, it may be difficult to completely remove various sizes of particles from the surfaces of the wafers by only collision between the cleaning solution and the microbubbles in the cleaning bath.

SUMMARY

Embodiments provide a method of sufficiently removing various sizes of particles from the surfaces of wafers sliced from an ingot.

Objects of embodiments are not limited to the aforementioned objects, and other unmentioned objects will be clearly understood by those skilled in the art based on the following description.

In one embodiment, a first cleaning apparatus includes a first cleaning bath, a cover provided at the upper part of the first cleaning bath, a drainage portion provided at the lower part of the first cleaning bath, a first cleaning unit and a second cleaning unit provided respectively at a first side surface and a second side surface in the first cleaning bath, and first and second moving units configured to move the first and second cleaning units, respectively, wherein each of the first and second cleaning units includes a plurality of cleaning solution supply pipes provided at different heights and a plurality of nozzles provided at each of the plurality of cleaning solution supply pipes, the plurality of nozzles provided at one cleaning solution supply pipe has identical cleaning solution spray angles, and the pluralities of nozzles provided at the other cleaning solution supply pipes have different cleaning solution spray angles.

The first cleaning unit and the second cleaning unit may be disposed so as to be opposite each other in the state in which a central area of the first cleaning bath is located therebetween.

The first and second moving units may move the first and second cleaning units in a horizontal direction, respectively.

Each of the first and second cleaning units may include first to n-th (n being an integer of 2 or more) cleaning solution supply pipes disposed in an upward-downward direction, and the spray angle of the nozzles provided at the first cleaning solution supply pipe may be less than ±10° relative to the horizontal direction.

The spray angle of the nozzles provided at an m-th (m being an integer less than n) cleaning solution supply pipe may be greater than the spray angle of the nozzles provided at the n-th cleaning solution supply pipe. Here, the spray angle may be the spray angle of the nozzles relative to the horizontal direction.

The spray angle of the nozzles provided at the n-th cleaning solution supply pipe may form an angle of 30 to 50° downwards relative to the horizontal direction.

The plurality of nozzles may supply a cleaning solution including pure water (DIW) and a surfactant.

Opening time of a valve provided at the first cleaning solution supply pipe may be longer than opening time of a valve provided at the n-th cleaning solution supply pipe.

In another embodiment, cleaning equipment includes the first cleaning apparatus, a second cleaning apparatus disposed adjacent to the first cleaning apparatus, the second cleaning apparatus including a second cleaning bath, pure water stored in the second cleaning bath, an ultrasonic generation unit provided at the lower part of the second cleaning bath, and an agitation unit configured to vibrate the second cleaning bath in a vertical direction, a third cleaning apparatus disposed adjacent to the second cleaning apparatus, the third cleaning apparatus including a third cleaning bath and a separation solution stored in the third cleaning bath, the separation solution being configured to separate a plurality of ingots from a beam, and a transfer apparatus configured to transfer the plurality of wafers from the third cleaning apparatus to a storage apparatus.

The cleaning solution supplied from the nozzles and the pure water in the second cleaning bath of the second cleaning apparatus may have identical compositions.

The size of first particles separated from the wafers in the first cleaning apparatus may be greater than the size of second particles separated from the wafers in the second cleaning apparatus.

The plurality of wafers may be fixed to a beam via a bonding layer, and the separation solution may dissolve the bonding layer to individually separate the plurality of wafers from the beam in the third cleaning apparatus.

The plurality of wafers may be fixed to a beam via a bonding layer, and the cleaning equipment may further include a jig configured to hold a plate connected to the beam and to move the wafers from the first cleaning apparatus to the second cleaning apparatus or from the second cleaning apparatus to the third cleaning apparatus.

The transfer apparatus may insert the plurality of wafers into separate areas of a cassette one by one.

In a further embodiment, a cleaning method includes (a) spraying a cleaning solution to a plurality of wafers fixed to a beam to separate large particles from surfaces of the wafers in a first cleaning apparatus, (b) separating small particles from the surfaces of the plurality of wafers fixed to the beam in a second cleaning apparatus, and (c) separating the plurality of wafers from the beam in a third cleaning apparatus.

The small particles may be separated from the wafers using ultrasonic waves and through agitation of pure water in step (b).

A jig may hold a plate connected to the beam to move the plurality of wafers between step (a) and step (b) or between step (b) and step (c).

The cleaning method may further include (d) transferring the wafers separated in step (c) one by one and inserting each wafer into a cassette.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Reference will now be made in detail to embodiments, examples of which are illustrated in the accompanying drawings.

However, embodiments of the present invention may be modified in various different forms, and the scope of the present invention is not limited to the following embodiments. Embodiments of the present invention are provided merely to more completely explain the present invention to a person having ordinary skill in the art to which the present invention pertains.

In addition, relational terms, such as "first," "second," "on/upper part/above," and "under/lower part/below," are used only to distinguish between one subject or element and another subject or element without necessarily requiring or involving any physical or logical relationship or sequence between such subjects or elements.

Figure 1:
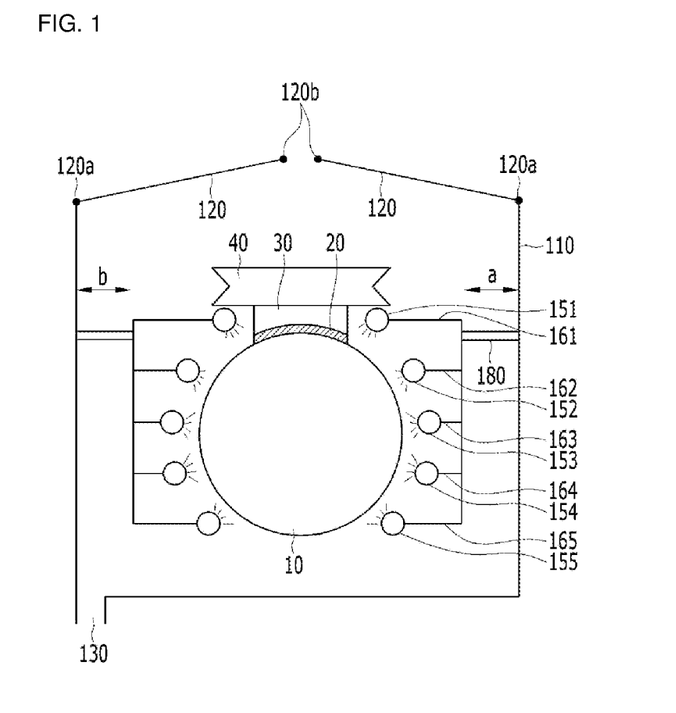
FIG. 1 is a view showing an embodiment of a first cleaning apparatus.
Figure 2:
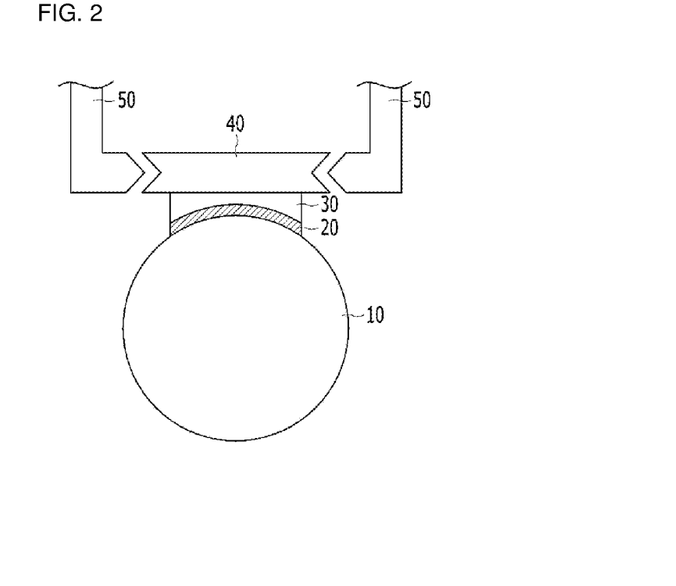
FIG. 2 is a view showing an ingot block that is supplied to the first cleaning apparatus of FIG. 1.

FIG. 1 is a view showing an embodiment of a first cleaning apparatus, and FIG. 2 is a view showing an ingot block that is supplied to the first cleaning apparatus of FIG. 1. Hereinafter, the embodiment of the first cleaning apparatus will be described with reference to FIGS. 1 and 2.

As shown, the embodiment of the first cleaning apparatus 100 includes a first cleaning bath 110, a cover 120 provided at the upper part of the first cleaning bath 110, a drainage portion 130 provided at the lower part of the first cleaning bath 110, a first cleaning unit and a second cleaning unit provided at a first side surface and a second side surface in the first cleaning bath 110, respectively, and first and second moving units (not shown) configured to move the first and second cleaning units, respectively.

The cover 120 is provided at the upper part of the first cleaning bath 110. A first end 120a of the cover may be fixed to the first cleaning bath 110, and second ends 120b thereof may be spaced apart from each other or may be in contact with each other to close the upper part of the first cleaning bath 110.

The drainage portion 130 is provided at the lower part of the first cleaning bath 110. The drainage portion 130 may discharge pure water (DIW) and a surfactant supplied after cleaning of wafers and particles out of the first cleaning bath 110.

The first cleaning unit and the second cleaning unit are provided in the first cleaning bath 110. The first cleaning unit and the second cleaning unit may be disposed so as to be opposite each other in the state in which a central area of the first cleaning bath 110, in which wafers are disposed, is located therebetween. In FIG. 1, the first cleaning unit and the second cleaning unit are disposed in symmetry in the state in which wafers are located therebetween and thus will not be described separately.

Although not shown, the first and second moving units may be connected to the first and second cleaning units to move the first and second cleaning units in a horizontal direction, specifically in an "a" direction and a "b" direction, respectively. That is, when the ingot block of FIG. 2 is introduced into the cleaning bath 110, the first and second moving units move the first and second cleaning units in directions toward side walls of the cleaning bath 110 in order to secure a wide central area of the cleaning bath 110. After the ingot block is introduced into the central area of the cleaning bath 110, the first and second moving units may move the first and second cleaning units to positions adjacent to the ingot block.

For example, the first cleaning unit may include a plurality of cleaning solution supply pipes 161 to 165 provided at different heights, pluralities of nozzles 151 to 155 provided at the cleaning solution supply pipes 161 to 165, respectively, and a first cleaning solution supply line 180 configured to supply a cleaning solution to the plurality of cleaning solution supply pipes 161 to 165.

Figure 3:
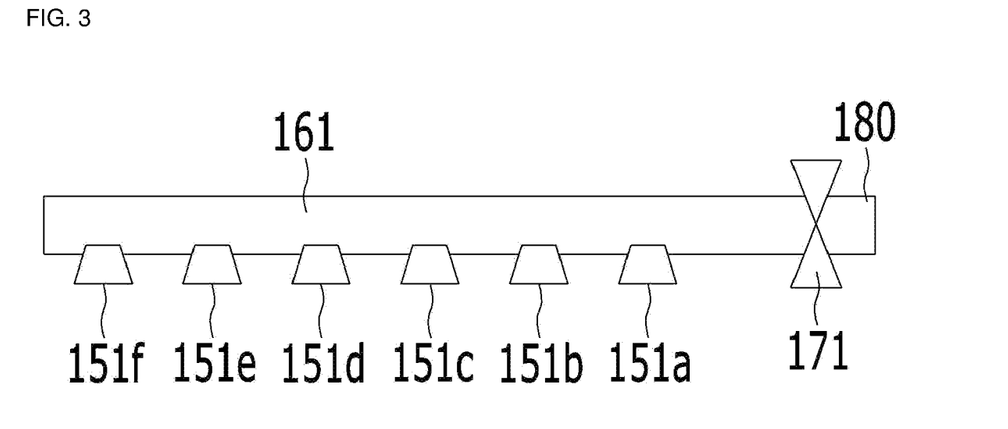
FIG. 3 is a view showing the construction of a cleaning solution supply pipe and nozzles of FIG. 1.

FIG. 3 is a view showing the construction of the cleaning solution supply pipe and the nozzles of FIG. 1.

A valve 171 may be provided between the cleaning solution supply line 180 and the cleaning solution supply pipe 161 to adjust the flow rate of a cleaning solution that is supplied from the cleaning solution supply line 180 to the cleaning solution supply pipe 161. The cleaning solution supply pipe 161 is provided with a plurality of nozzles 151a to 151f. The number of nozzles 151a to 151f is not limited to 6, and the spray angles, flow rates, and intensities of a cleaning solution sprayed from the nozzles 151a to 151f connected to the cleaning solution supply pipe 161 in a direction toward the ingot block may be equal to each other.

In the ingot block of FIG. 2, a plurality of wafers 10 separated from an ingot is fixed to a beam 30 via a bonding layer 20, and a jig 50 holds a plate 40 connected to the upper part of the beam 30 in order to introduce the ingot block into the first cleaning bath 110 or to remove the ingot block from the first cleaning bath 110.

Recesses may be formed in opposite side surfaces of the plate 40, and the jig 50 may be inserted into the pair of recesses to hold the plate 40. The jig 50 may move the ingot block to another cleaning bath, a description of which will follow, in addition to introduction of the ingot block into the first cleaning bath 110 or removal of the ingot block from the first cleaning bath 110.

The bonding layer is made of calcium carbonate. Although the plurality of wafers 10 is sliced from the ingot, the plurality of wafers 10 is fixed to the beam 30. For this reason, the wafers 10 may be called an ingot block. The wafers 10 fixed to the beam 30 may be spaced apart from each other by about 0.3 mm. In FIG. 1, the cleaning solution is sprayed to the wafers 10 at high pressure to mainly remove large particles on the surfaces of the wafers 10 and between the wafers 10.

Each of the first and second cleaning units may include first to n-th cleaning solution supply pipes disposed in an upward-downward direction. Here, n may be an integer of 2 or more. In FIG. 1, n is 5, and therefore each of the first and second cleaning units includes five cleaning solution supply pipes.

In FIG. 1, first to fifth cleaning solution supply pipes 161 to 165 may be provided in the upward-downward direction, and the first to fifth cleaning solution supply pipes 161 to 165 may be provided with pluralities of nozzles 151 to 155, respectively. A cleaning solution may be supplied to the first to fifth nozzles 151 to 155 from the cleaning solution supply line 180 via the first to fifth cleaning solution supply pipes 161 to 165, and may then be sprayed from the first to fifth nozzles 151 to 155.

At this time, the spray angles of the cleaning solution sprayed from the first to fifth nozzles 151 to 155 provided respectively at the first to fifth cleaning solution supply pipes 161 to 165 in a direction toward the wafers 10 may be different from each other.

Figure 4A:
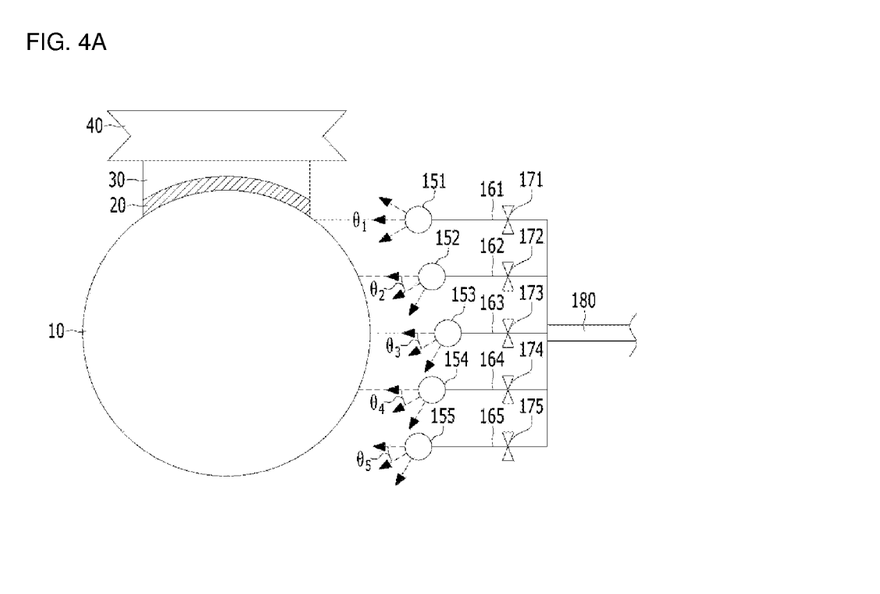
FIG. 4A is a view showing cleaning solution spray angles of nozzles provided at a plurality of cleaning solution supply pipes of FIG. 1.

FIG. 4A is a view showing cleaning solution spray angles of the nozzles provided at the plurality of cleaning solution supply pipes of FIG. 1. Each of the cleaning solution supply pipes is provided with a plurality of nozzles, as shown in FIG. 3. In FIG. 4A, the spray angles of the nozzles will be described based on a horizontal direction.

The first and second cleaning units are provided in symmetry in the state in which the wafers are located therebetween. In FIG. 4A, only the first cleaning unit, which is located at the right side, will be described for convenience of description.

In FIG. 4A, the cleaning solution spray angle θ1 of the nozzles 151 provided at the first cleaning solution supply pipe 161 may be less than ±10° relative to the horizontal direction. Here, the spray angle θ1 is an angle between the central part of the cleaning solution sprayed from the nozzles 151 and an imaginary line in the horizontal direction.

The cleaning solution spray angles of the nozzles 151 to 155 may gradually increase relative to the horizontal direction from the first cleaning solution supply pipe 161 to the fifth cleaning solution supply pipe 165. That is, in FIG. 4A, θ1<θ2<θ3<θ4<θ5 or θ1<θ2=θ3=θ4=θ5. Although the spray angle θ1 may be ±10° relative to the horizontal direction, the other angles θ2 to θ5 may be directed downwards relative to the horizontal direction. Also, in FIG. 4A, the spray angle θ5 of the nozzles provided at the fifth cleaning solution supply pipe 165, which is the lowest cleaning solution supply pipe, may form an angle of 30 to 50° downwards relative to the horizontal direction.

In the arrangement of the cleaning solution supply pipes described above, the nozzles 151 provided at the first cleaning solution supply pipe 161 supply the cleaning solution to upper areas of the wafers. At this time, the cleaning solution may clean the upper areas of the wafers and may then flow to the lower areas of the wafers along the surfaces of the wafers.

Since the nozzles 155 provided at the fifth cleaning solution supply pipe 165 are located at heights similar to the lower areas of the wafers, the cleaning solution may be supplied from the nozzles 155 provided at the fifth cleaning solution supply pipe 165 to the lower parts of the wafers.

Here, the cleaning solution supplied from the first cleaning solution supply pipe 161 may be sprayed to the upper areas of the wafers 10 and may then flow to the lower areas of the wafers 10, whereas the cleaning solution supplied from the fifth cleaning solution supply pipe 165 may be directly sprayed to the lower areas of the wafers 10.

As a result, time for which the cleaning solution supplied to the upper areas of the wafers 10 cleans the surfaces of the wafers may be longer than time for which the cleaning solution supplied to the lower areas of the wafers 10 cleans the surfaces of the wafers. Consequently, opening time of the valve 171 provided at the first cleaning solution supply pipe 161 may be set to be longer than opening time of the valve provided at the n-th cleaning solution supply pipe.

In addition, opening time of the valve provided at the m-th (m being an integer less than n) cleaning solution supply pipe may be longer than opening time of the valve provided at the (m+1)-th cleaning solution supply pipe.

Figure 4B:
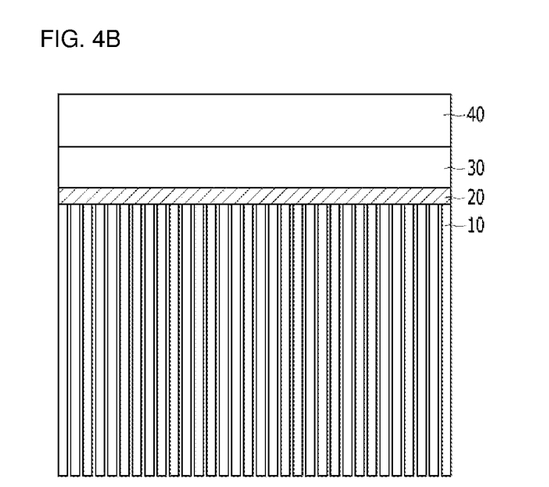
FIGS. 4B and 4C are views showing that a cleaning solution is supplied to the ingot block.
Figure 4C:
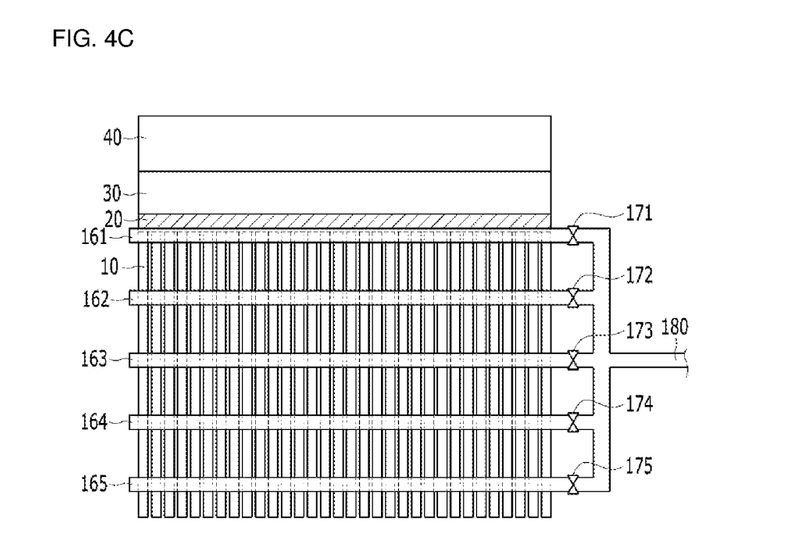

FIGS. 4B and 4C are views showing that the cleaning solution is supplied to the ingot block.

FIG. 4B is a side view of the ingot block, in which the plurality of wafers 10, spaced apart from each other, is fixed to the beam 30 via the bonding layer 20, and the plate 40 is connected to the upper part of the beam 30.

FIG. 4C shows that the cleaning solution is supplied to the ingot block shown in FIG. 4B. Specifically, the cleaning solution may be supplied to the first to fifth nozzles (not shown) from the cleaning solution supply line 180 via the first to fifth cleaning solution supply pipes 161 to 165, and may then be supplied to the wafers 10 through the first to fifth nozzles.

The valves 171 to 175 are provided between the cleaning solution supply line 180 and the first to fifth cleaning solution supply pipes 161 to 165, respectively, to adjust the flow rate of the cleaning solution supplied from the cleaning solution supply line 180.

The pluralities of first nozzles to fifth nozzles (not shown) may be provided at the rear surfaces of the first to fifth cleaning solution supply pipes 161 to 165, respectively, to spray the cleaning solution in the direction toward the wafers 10. Here, the "rear surfaces" may be side surfaces of the first to fifth cleaning solution supply pipes 161 to 165 opposite the wafers 10.

Figure 5:
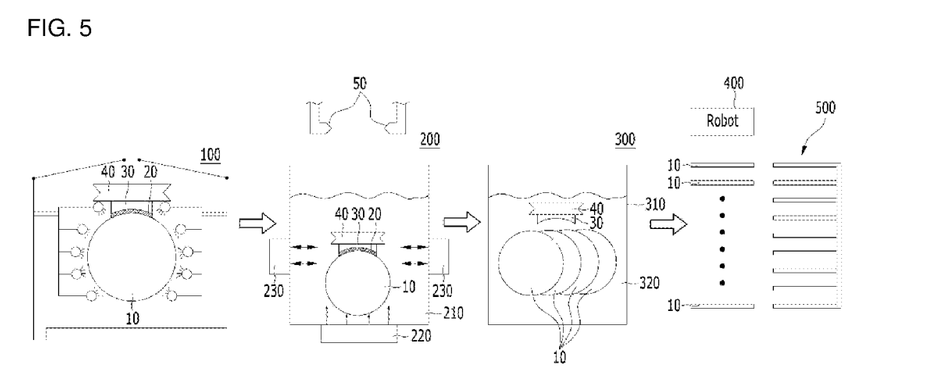
FIG. 5 is a view showing the construction of an embodiment of cleaning equipment including the first cleaning apparatus.
Figure 6:
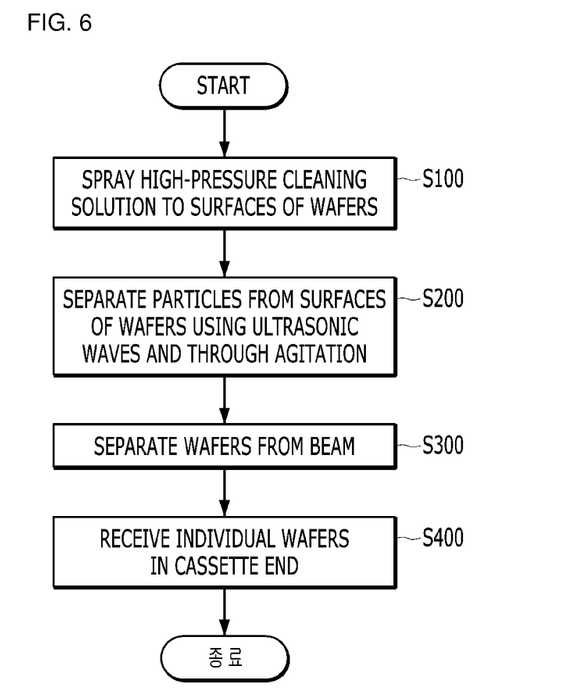
FIG. 6 is a flowchart of a cleaning method according to the present invention.

FIG. 5 is a view showing the construction of cleaning equipment including the first cleaning apparatus, and FIG. 6 is a flowchart of a cleaning method according to the present invention. Hereinafter, the cleaning equipment and the cleaning method according to the present invention will be described with reference to FIGS. 5 and 6.

First, the first cleaning apparatus cleans wafers. Specifically, the first cleaning apparatus may spray a high-pressure cleaning solution to the surfaces of the wafers to clean the wafers (S100).

At this time, the plurality of cleaning solution supply pipes provided at the first cleaning apparatus 100 may simultaneously supply the cleaning solution to the wafers or may alternately supply the cleaning solution to the wafers at predetermined time intervals. At this time, the number of supplies of the cleaning solution from the upper cleaning solution supply pipe may be greater than the number of supplies of the cleaning solution from the lower cleaning solution supply pipe.

Table 1 shows an embodiment of supply order and cleaning time of the cleaning solution from the first to fifth cleaning solution supply pipes.

TABLE 1

| Order | Cleaning solution supply pipe | Left and/or right | Cleaning time (h:m:s) |
|---|---|---|---|
| 1 | First cleaning solution supply pipe | Left | 00:01:00 |
| 2 | Second cleaning solution supply pipe | Left | 00:01:00 |
| 3 | Third cleaning solution supply pipe | Left | 00:01:00 |
| 4 | First cleaning solution supply pipe | Right | 00:01:00 |
| 5 | Second cleaning solution supply pipe | Right | 00:01:00 |
| 6 | Third cleaning solution supply pipe | Right | 00:01:00 |
| 7 | Fourth cleaning solution supply pipe | Left/Right | 00:01:00 |
| 8 | Fifth cleaning solution supply pipe | Left/Right | 00:01:00 |

As shown in Table 1, the valves connected to the first, second, and third cleaning solution supply pipes provided at the left side of the wafers may be opened, and the cleaning solution may be supplied from the nozzles connected to the first, second, and third cleaning solution supply pipes to the wafers. Subsequently, the valves connected to the first, second, and third cleaning solution supply pipes provided at the right side of the wafers may be opened, and the cleaning solution may be supplied from the nozzles connected to the first, second, and third cleaning solution supply pipes to the wafers. Subsequently, the valves connected to the fourth and fifth cleaning solution supply pipes provided at the left and right sides of the wafers may be opened, and the cleaning solution may be supplied from the nozzles connected to the fourth and fifth cleaning solution supply pipes to the wafers. At this time, opening times of the valves of the respective cleaning solution supply pipes may be equal to each other, and may be, for example, 1 minute.

In Table 1, the cleaning solution may be sprayed from the left upper areas to the central areas of the wafers, the cleaning solution may be sprayed from the right upper areas to the central areas of the wafers, and the cleaning solution may be sprayed from the left and right lower areas of the wafers. Another cleaning method may be used depending on the properties of wafers to be cleaned.

The first cleaning apparatus may directly spray the cleaning solution to the surfaces of the wafers to separate relatively large particles from the wafers.

Subsequently, a second cleaning apparatus 200 disposed adjacent to the first cleaning apparatus 100 cleans the wafers. At this time, the wafers may be delivered from the first cleaning apparatus 100 to the second cleaning apparatus 200 using the jig described above.

A second cleaning bath 210 of the second cleaning apparatus 200 may be filled with pure water (DIW). A surfactant may be added to the pure water in the second cleaning bath 210. At this time, the pure water in the second cleaning bath 210 may have the same composition as the first cleaning solution that the first cleaning apparatus 100 sprays to the wafers.

An ultrasonic generation unit 220 may be provided at the lower part of the second cleaning bath 210 of the second cleaning apparatus 200, and an agitation unit 230 configured to vibrate the second cleaning bath 210 may also be provided. The ultrasonic generation unit 220 may generate ultrasonic waves, and the pure water (DIW) in the second cleaning bath 210 may be moved in a predetermined direction by the agitation unit 230. At this time, the size of particles separated from the wafers by the second cleaning apparatus 200 may be less than the size of particles separated from the wafers by the first cleaning apparatus 100. Here, the "size" may be a diameter in the case in which each particle is spherical and the length of one surface in the case in which each particle is polyhedral.

The second cleaning apparatus 200 may separate and remove small particles from the wafers using the ultrasonic waves and through agitation (S200).

A third cleaning apparatus 300 may be disposed adjacent to the second cleaning apparatus 200. The third cleaning apparatus 300 may include a third cleaning bath 310, the interior of which may be filled with a separation solution 320.

The wafers may be delivered from the second cleaning apparatus 200 to the third cleaning apparatus 300 using the jig described above. At this time, the wafers introduced into the third cleaning apparatus 300 may be in the state in which the plurality of wafers 10 is fixed to the beam 30 via the bonding layer 20 and the beam 30 is connected to the plate 40, which is located above the beam 30, as shown in FIG. 2.

The bonding layer 20, which is mainly made of calcium carbonate, may be dissolved by the separation solution 320 in the third cleaning bath 310, whereby the wafers 10 may be separated from the beam 30 (S300). The temperature of the separation solution 320 may be high, and the bonding layer may be dissolved by the high-temperature separation solution 320.

The first cleaning apparatus 100 may spray no cleaning solution to the beam 30 and the plate 40, whereas the beam 30 and the plate 40 of the ingot block may be soaked in the pure water in the second cleaning bath 210 of the second cleaning apparatus 200 and the separation solution 320 in the third cleaning bath 310 of the third cleaning apparatus 300.

Subsequently, the individually separated wafers may be removed out of the third cleaning bath 310, and fine particles may be further removed from the surfaces of the wafers using a brush.

Subsequently, a transfer apparatus 400 may transfer the individually separated wafers to a storage apparatus 500. For example, the storage apparatus 500 may be a cassette-type storage apparatus, and the wafers may be inserted into separate areas of the cassette one by one (S400).

Figure 7:
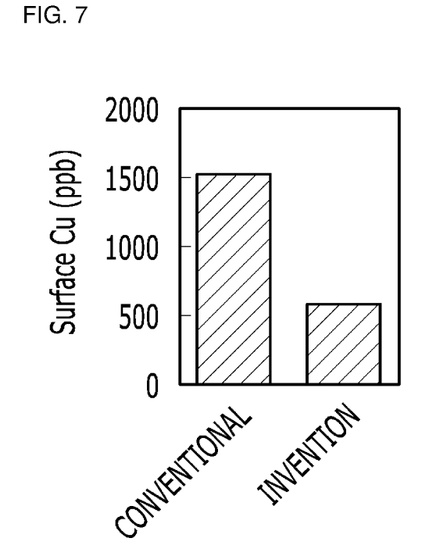
FIG. 7 is a view showing effects of a first cleaning apparatus according to the present invention, cleaning equipment including the same, and a cleaning method.

FIG. 7 is a view showing effects of the first cleaning apparatus according to the present invention, the cleaning equipment including the same, and the cleaning method.

In FIG. 7, the vertical axis indicates the copper contamination degree on the surface of a wafer after cleaning. It can be seen that particle, especially copper (Cu), contamination degree on the surface of the wafer after cleaning using the apparatus and method according to the present invention is remarkably lower than copper contamination degree on the surface of the wafer after cleaning using a conventional apparatus and method.

As is apparent from the above description, in a first cleaning apparatus according to the embodiment, cleaning equipment including the same, and a cleaning method, large particles are mainly removed from the surfaces of wafers using a high-pressure cleaning solution sprayed by the first cleaning apparatus, small particles are mainly removed from the surfaces of the wafers in a second cleaning apparatus using ultrasonic waves and through agitation of the cleaning solution, and the surfaces of the wafers are further brushed using a brush, whereby the particles may be removed from the surfaces of the wafers through cleaning after a slicing process.

It should be noted that the effects of embodiments are not limited to the effects mentioned above, and other unmentioned effects will be clearly understood by those skilled in the art from the above description.

Although embodiments have been described with reference to the drawings, it should be understood that the present invention is not limited to the above embodiments and various modifications and alterations are possible by those skilled in the art to which the present invention pertains.

Therefore, the scope of the present invention is not defined by the embodiments described above but is defined by the accompanying claims and equivalents thereto.

What is claimed is:

1. A first cleaning apparatus comprising:
   a first cleaning bath;
   a cover provided at an upper part of the first cleaning bath;
   a drainage portion provided at a lower part of the first cleaning bath;
   a first cleaning unit and a second cleaning unit provided respectively at a first side surface and a second side surface in the first cleaning bath; and
   a first moving unit configured to move the first cleaning unit horizontally within the first cleaning bath;
   a second moving unit configured to move the second cleaning unit horizontally within the first cleaning bath;
   wherein the first and second moving units allow the first and second cleaning units to be moved horizontally towards or horizontally away from each other;
   wherein each of the first and second cleaning units separately comprises:
      a plurality of cleaning solution supply pipes each provided at a different height;
      a valve separately provided at each of the plurality of cleaning solution supply pipes; and
      a plurality of nozzles provided at each separate one of the plurality of cleaning solution supply pipes;
   wherein the plurality of nozzles provided at a first cleaning solution pipe of the cleaning solution pipes of the first cleaning unit have a same first cleaning solution spray angle;
   wherein the plurality of nozzles provided at another one of the cleaning solution supply pipes of the first cleaning unit have a different cleaning solution spray angle as compared to the first cleaning solution spray angle of the plurality of nozzles at the first cleaning solution supply pipe of the first cleaning unit;
   wherein the first cleaning unit comprises n (n being an integer of 2 or more) cleaning solution supply pipes disposed in a vertical direction, and the second cleaning unit comprises n cleaning solution supply pipes disposed in a vertical direction;
   wherein the first cleaning solution supply pipe of the first cleaning unit is a vertically highest cleaning solution pipe of the cleaning solution pipes of the first cleaning unit;
   wherein an n-th cleaning solution supply pipe of the first cleaning unit is a vertically lowest cleaning solution supply pipe of the cleaning solution supply pipes of the first cleaning unit;
   wherein an n-th cleaning solution supply pipe of the second cleaning unit is a vertically lowest cleaning solution supply pipe of the cleaning solution supply pipes of the second cleaning unit;
   wherein the spray angle of the nozzles provided at the first cleaning solution supply pipe of the first cleaning unit is within ±10° relative to horizontal, and the spray angle of the nozzles provided at a first one of the cleaning solution supply pipes of the second cleaning unit is within ±10° relative to horizontal; and
   wherein the plurality of nozzles of the n-th cleaning solution supply pipe of the first cleaning unit each have a spray angle that is pointed more downwardly relative to horizontal than a plurality of nozzles provided at an m-th (m being an integer less than n) cleaning solution supply pipe of the cleaning solution supply pipes of the first cleaning unit.

2. The first cleaning apparatus according to claim 1, wherein the first cleaning unit and the second cleaning unit are disposed so as to be opposite each other in a state in which a central area of the first cleaning bath is located therebetween.

3. The first cleaning apparatus according to claim 1, wherein the spray angle of the nozzles provided at the n-th cleaning solution supply pipe of the first cleaning unit is an angle of 30 to 50° downwards relative to the horizontal direction.

4. The first cleaning apparatus according to claim 1, wherein the first and second cleaning units provide a cleaning solution comprising pure water (DIW) and a surfactant.

5. The first cleaning apparatus according to claim 1, wherein an opening time of the valve provided at the first cleaning solution supply pipe of the first cleaning unit is longer than an opening time of the valve provided at the n-th cleaning solution supply pipe of the first cleaning unit.

6. Cleaning equipment comprising:
   the first cleaning apparatus according to claim 1;
   a second cleaning apparatus disposed adjacent to the first cleaning apparatus, the second cleaning apparatus comprising a second cleaning bath, pure water stored in the second cleaning bath, an ultrasonic generation unit provided at a lower part of the second cleaning bath;
   a third cleaning apparatus disposed adjacent to the second cleaning apparatus, the third cleaning apparatus comprising a third cleaning bath and a separation solution stored in the third cleaning bath, the separation solution being configured to separate a plurality of wafers from a beam; and a transfer apparatus configured to transfer the plurality of wafers from the third cleaning apparatus to a storage apparatus.

7. The cleaning equipment according to claim 6, wherein a size of first particles separated from wafers in the first cleaning apparatus is greater than a size of second particles separated from wafers in the second cleaning apparatus.

8. The cleaning equipment according to claim 6, wherein the plurality of wafers is fixed to the beam via a bonding layer, and the separation solution dissolves the bonding layer to individually separate the plurality of wafers from the beam in the third cleaning apparatus.

9. The cleaning equipment according to claim 6, wherein
   the plurality of wafers is fixed to the beam via a bonding layer, and
   the cleaning equipment further comprises a jig configured to hold a plate connected to the beam and to move the wafers from the first cleaning apparatus to the second cleaning apparatus or from the second cleaning apparatus to the third cleaning apparatus.

10. The cleaning equipment according to claim 6, wherein the transfer apparatus inserts the plurality of wafers into separate areas of a cassette one by one.

* * * * *